US007217980B2

(12) United States Patent
Chen et al.

(10) Patent No.: US 7,217,980 B2
(45) Date of Patent: May 15, 2007

(54) CMOS SILICON-CONTROL-RECTIFIER (SCR) STRUCTURE FOR ELECTROSTATIC DISCHARGE (ESD) PROTECTION

(75) Inventors: Shiao-Shien Chen, Chung-Li (TW); Tien-Hao Tang, Hsin-Chu (TW); Mu-Chun Wang, Hsin-Chu (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 10/954,735

(22) Filed: Sep. 30, 2004

(65) Prior Publication Data

US 2005/0110092 A1    May 26, 2005

Related U.S. Application Data

(60) Division of application No. 09/952,125, filed on Sep. 14, 2001, now abandoned, and a continuation-in-part of application No. 09/396,165, filed on Sep. 14, 1999, now abandoned.

(51) Int. Cl.
  *H01L 23/62* (2006.01)
  *H01L 29/74* (2006.01)
  *H01L 31/111* (2006.01)
(52) U.S. Cl. .................. 257/357; 257/112; 257/121; 257/173; 257/356; 257/361; 257/362
(58) Field of Classification Search ............... 257/357, 257/362, 361, 356, 112, 121, 173
See application file for complete search history.

(56) References Cited

U.S. PATENT DOCUMENTS

| 5,343,053 A * | 8/1994 | Avery ......................... 257/173 |
| 5,455,436 A * | 10/1995 | Cheng ......................... 257/356 |
| 5,602,404 A * | 2/1997 | Chen et al. .................. 257/112 |
| 5,856,214 A * | 1/1999 | Yu ............................... 438/133 |
| 6,246,079 B1 * | 6/2001 | Chen ........................... 257/173 |

* cited by examiner

*Primary Examiner*—Shouxiang Hu
(74) *Attorney, Agent, or Firm*—Squire, Sanders & Dempsey

(57) ABSTRACT

An electrostatic discharge protection device, including a silicon-control-rectifier, in complementary metal-oxide semiconductor (CMOS) process is disclosed. in one embodiment of the present invention, the protection device includes a semiconductor substrate having a first conductivity type. A well region formed with a second conductivity type in the semiconductor substrate. A first region formed in the well region. A second region formed having a portion in the weil region and another portion outside the well region, but still within the semiconductor substrate. Moreover, a third region formed within the well region and in between the first; region and the second region. A fourth region formed within the semiconductor substrate and outside the well region. A fifth region formed within the semiconductor substrate and in between the second region and the fourth region. Furthermore, the second region and the fifth region form the $n^+$-$p^+$ junction of a zener diode and the breakdown voltage of the zener diode is controlled by adjusting the ion dosage in the second region.

18 Claims, 3 Drawing Sheets

CMOS SILICON-CONTROL-RECTIFIER (SCR) STRUCTURE FOR ELECTROSTATIC DISCHARGE (ESD) PROTECTION

CROSS-REFERENCE TO RELATED APPLICATION

This application is a divisional application of U.S. patent application Ser. No. 09/952,125 filed Sep. 14, 2001 now abandoned.

BACKGROUND OF THE INVENTION

This application is a continuation-in-part of U.S. patent application Ser. No. 09/396,165, filed Sep. 14, 1999 now abandoned.

1. Field of the Invention

The present invention relates to electrostatic discharge (ESD) protection, and more particularly, to a complementary metal-oxide semiconductor (CMOS) silicon-control-rectifier (SCR) structure suitable for protecting an internal circuit from ESD.

2. Description of the Prior Art

Progress in semiconductor technology has decreased the dimensions of many semiconductor devices. As very large scale integration (VLSI) circuit geometry continues to shrink, the corresponding gate oxide thickness has also continued to decrease. This decrease in thickness, relative to breakdown voltage, has resulted in an increased susceptibility to damage from the application of excessive voltages. For example, an electrostatic discharge (ESD) event is capable of developing such an excess voltage. During an ESD event, charge is transferred between one or more pins of the device and another conducting object in a time period that is typically less than one microsecond. This charge transfer can develop voltages that are large enough to break down insulating films (e.g., gate oxides) on the device, or can dissipate sufficient energy to cause electrothermal failures in the device. Such failures include contact spiking, silicon melting, or metal interconnect melting.

Accordingly, ESD protection and its impact on the reliability of IC products in submicron CMOS technologies has become a primary concern. The resulting protection circuits may typically be connected to all Input/Output (I/O) pads of an integrated circuit (IC) to safely dissipate the energy associated with ESD events without causing any damage to the circuitry internal to the device. Protection circuits have also been connected to power supply pads, or between power supply buses to prevent such damage to internal circuits.

An ESD protection circuit that includes a silicon-control-rectifier (SCR) is considered to have very good electrostatic discharge performance. Since the SCR ESD protection circuit has a low snap-back holding voltage of about 1–5 volts and a low effective resistance of about 1–3 Ohms, it provides a very good discharge condition for the electrostatic current. However, there is one inherent constraining design factor for the SCR used in ESD protection circuits for sub-micron semiconductor devices. The trigger voltage for SCRs in sub-micron CMOS devices is in the range of 30 to 50 Volts. The typical thickness of gate oxide layers in CMOS fabrication processes employing a resolution of 0.6–0.8 microns is about 150–200 angstroms. Considering a dielectric breakdown strength of 10 MV/cm for typical $SiO_2$ material, the gate oxide layers in these sub-micron CMOS devices would be destroyed by a voltage of about 15–20 volts. Therefore, SCRs with a trigger voltage in the range of 30–50 volts must be fitted with other protection components so that they can provide protection for gate oxide layers in sub-micron CMOS IC devices.

Efforts have been made to lower the trigger voltage of SCRs in the ESD protection circuits for the sub-micron CMOS device. The trigger voltage should be reduced to below the dielectric breakdown voltage of the gate oxide layers of the CMOS device, so that the ESD protection circuits can provide protection for the CMOS device before being damaged themselves. Several ways to lower the trigger voltage of SCRs have already been proposed.

In one common approach, A. Chatterjee and T. Polgreen proposed a low-voltage trigger SCR (LVTSCR) configuration in "A LOW-VOLTAGE TRIGGERING SCR FOR ON-CHIP ESD PROTECTION AT OUTPUT AND INPUT PADS," IEEE Electron Device Letters, 12 (1), 1991, pp.21–22. In their disclosure, Chatterjee and Polgreen employed a short-channel NMOS transistor coupled to an SCR to form the low-voltage trigger SCR having a trigger voltage that is about equal to the breakdown voltage of the short-channel NMOS transistor.

Referring to FIG. 1A, a LVTSCR is placed in between an Input/Output pad 10 and an internal circuit 11 to be protected. The internal circuit 11 is tied to the Input/Output pad 10 via a conducting line 12. An SCR device serves as the main component in a protection circuit. In the drawing, the SCR device consists essentially of a PNP bipolar junction transistor T.sub.1 and an NPN bipolar junction transistor T.sub.2. The collector of the PNP transistor T.sub.1 is connected together with the base of the NPN transistor T.sub.2, forming a cathode gate identified by the node 13. The cathode gate 13 is coupled to the emitter of the NPN transistor T.sub.2, via a spreading resistor R.sub.p, constituting a cathode 14 which is connected to a Vss terminal of the CMOS IC device. The base of the PNP transistor T.sub.1 is connected together with the collector of NPN transistor T.sub.2 to form an anode gate identified by the node 15. The anode gate 15 is coupled to the emitter of the PNP transistor T.sub.1, via a spreading resistor R.sub.n, constituting an anode 16 which is connected to the conducting line 12. To achieve a reduction of the SCR trigger voltage from about 30–50 volts to a level less than the NMOS breakdown voltage of less than 15 volts, an NMOS-like structure N.sub.1 is incorporated in the SCR device as a trigger.

FIG. 1B shows a cross sectional view of a LVTSCR integrated circuit device 20 fabricated from a semiconductor substrate 21 of a first conductivity type, such as P-type conductivity, with various diffusions and circuits components formed thereon to provide protection against ESD damage due to excessive stresses. Accordingly, a thin-oxide NMOS field-effect transistor (MOSFET), is shown in the LVTSCR integrated circuit device 20 in the form of an N-channel device, composed of $N^+$ regions, 22 and 23, having a gate electrode 24 with a thin oxide 25 therebetween. The outer $N^+$ region 22 is coupled to an adjacent out $P^+$ conductivity region 26 by a contact or bus 27 which is connected to a negative voltage source VSS or ground. The Vss source is also coupled to the gate electrode 24 to keep the LVTSCR OFF during normal operation. To complete the LVTSCR, an N-well 28 is provided in substrate 21 that substantially overlaps $N^+$ region 23 and extends laterally beyond a second $N^+$ region 29 which is coupled to an adjacent inner $P^+$ conductivity region 30 by a contact or bus 31 connected to a Pad/Internal Circuit.

There exists a danger, since the N-well is lightly doped, that the SCR turn-on voltage may still be so high that the gate oxide of NMOS devices may become damaged. Thus, the LVTSCR device turn-on voltage is dependent on the NMOS breakdown voltage. It is therefore desirable to be able to reduce the trigger voltage required to turn ON a protective SCR as much as possible. Moreover, ESD protection by using the LVTSCR device is easily to be restricted in CMOS process, that is because the channel length of the additional NMOS device needs to be smaller than the output NMOS of the SCR for making sure the additional NMOS device breakdown before the NMOS device in CMOS output.

It is therefore an object of the present invention to provide an enhanced ESD protection performance apparatus for protecting VLSI circuits and particularly CMOS devices by reducing the trigger voltage required to turn ON a protective SCR.

SUMMARY OF THE INVENTION

An object of the present is to substantially obviate one or more of the problem caused by limitations and disadvantages of the related art.

Another object of the present invention is to provide an electrostatic discharge protection device that protects an internal circuit from the static electricity.

A further object of the present invention is to provide a silicon-control-rectifier having a much lower triggering voltage by using a zener diode trigger, which makes the design of ESD protection circuits in a more convenient manner with less restrictions as compare to the design of the channel lengths of NMOS devices in LVTSCR.

In accordance with the present invention, an electrostatic discharge protection device, including a silicon-control-rectifier, in complementary metal-oxide semiconductor (CMOS) process is provided. In one embodiment of the present invention, the protection device includes a semiconductor substrate having a first conductivity type in the semiconductor substrate. A first region formed within the semiconductor substrate and outside the well region. A second region formed within the semiconductor substrate and in between the first region and the well region. Moreover, a third region formed having a portion in the well region and another portion outside the well region. A fourth region formed in the well region. A fifth region also formed within the well region and in between the third region and the fourth region. Furthermore, the third region and the fifth region form the $P^+$-$N^+$ junction of the zener diode and the breakdown voltage of the zener diode is controlled by adjusting the ion dosage in the third region.

In another embodiment of the present invention, the protection device for protecting VLSI circuits and particularly CMOS devices by reducing the trigger voltage required to turn ON a protective SCR also includes a semiconductor substrate having a first conductivity type as well as a well region having a second conductivity type formed in the semiconductor substrate. A first region formed in the well region. A second region formed having a portion in the well region and another portion outside the well region. A third region formed within the well region and in between the first region and the second region. Moreover, a fourth region formed within the semiconductor substrate and outside the well region. A fifth region also formed within the semiconductor substrate and in between the second region and the fourth region. Furthermore, the second region and the fifth region form the $N^+$-$P^+$ junction of the zener diode and the breakdown voltage of the zener diode is controlled by adjusting the ion dosage in the second region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
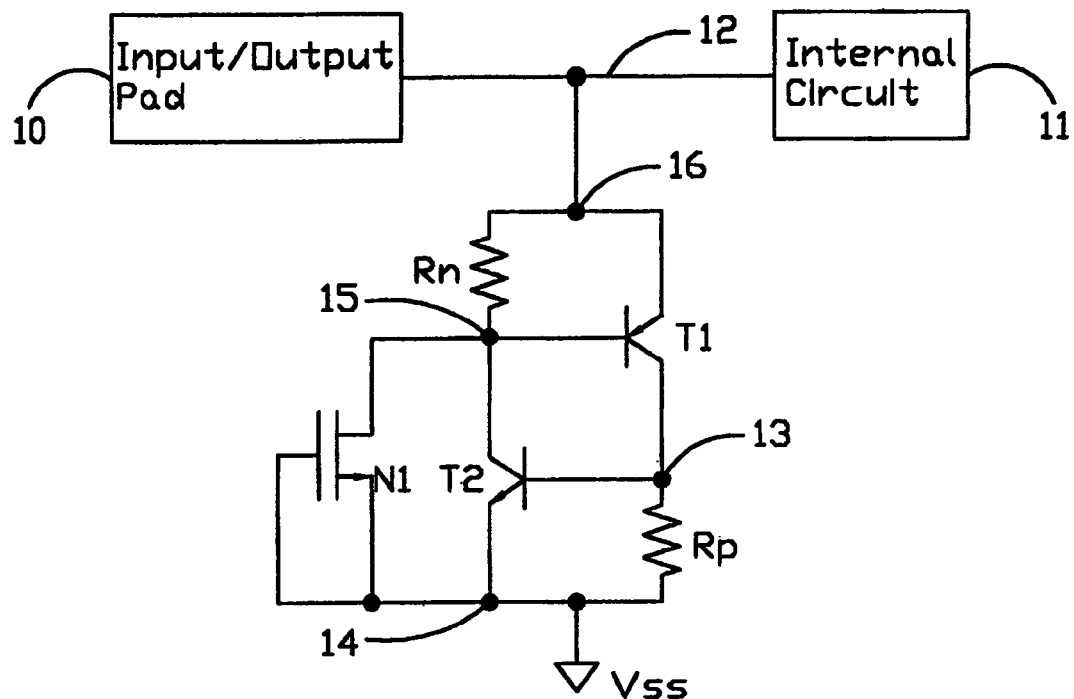
FIG. 1A is a conventional schematic diagram of a LVTSCR device been placed in between an I/O pad and an internal circuit.
Figure 1B:
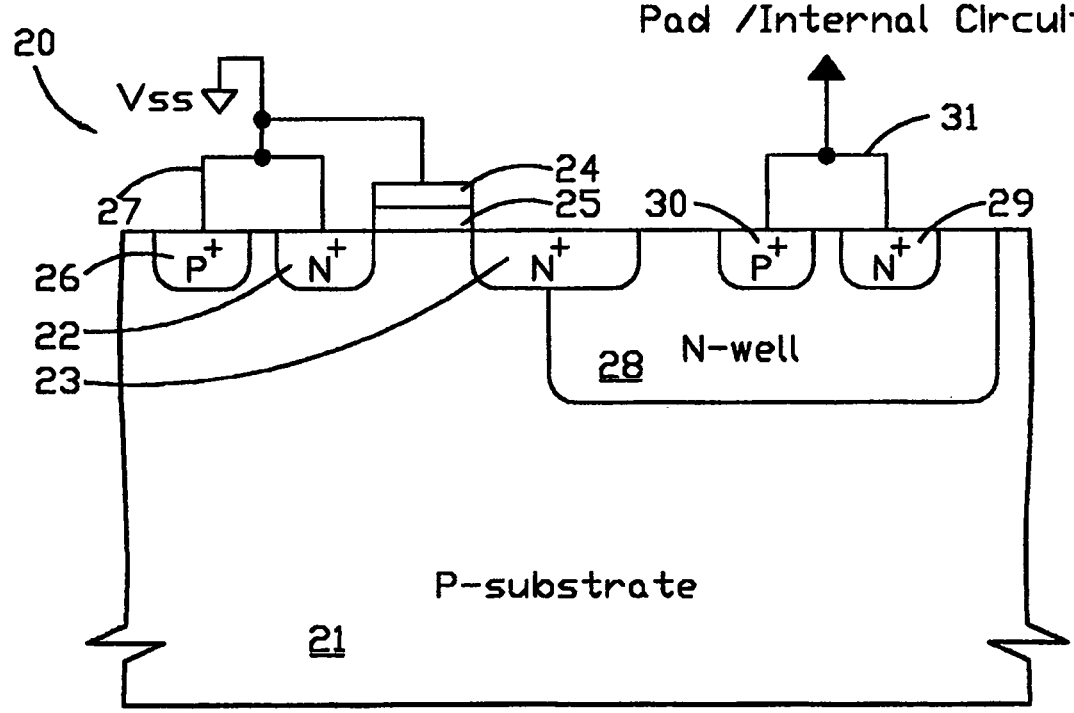
FIG. 1B is a diagrammatic illustration in section of a semiconductor device including a conventional LVTSCR protection circuit.

The present invention provides a protection device for protecting VLSI circuits, and particularly CMOS devices therein, from ESD damage and which are embodied in an improved combination of elements that act to provide a low turn-on voltage trigger for an SCR protecting device. The pads that interconnect a VLSI semiconductor chip with external circuits are typically provided with protection circuits that turn-on when an excessive voltage appears at a Pad, commonly caused by an ESD, to avoid possible internal damage to the chip circuits, such as the buffer circuits at an input Pad and the driver circuits at an output Pad. The protection circuit for CMOS device may involve an SCR which is formed of a PNP bipolar transistor and an NPN bipolar transistor that are interconnected so that the emitter-collector circuit of each transistor conducts the base current of the other. When either transistor is turned ON, it turns ON the other and both stay ON until the current is interrupted. As noted above, the SCR is an ideal device for on-chip protection against ESD since in its ON state it protects sensitive devices by virtue of its comparatively low resistance, and the failure threshold of the SCR is high because the heat generation is distributed over a large volume. However, there are sensitive devices that are damaged at voltages less than the SCR trigger voltage, which typically is comparatively high, so that in order to protect devices such as NMOS transistors, which have the lowest breakdown voltage in CMOS technology, a reduction of the SCR trigger voltage to a level less than the NMOS breakdown voltage, may be achieved by the use of an NMOS-like structure incorporated in the SCR device as a trigger. Such a prior art arrangement is shown in FIG. 1B.

Accordingly, a thin-oxide NMOS field-effect transistor (MOSFET), is shown in the LVTSCR integrated circuit device 20 in the form of an N-channel device, composed of $N^+$ regions, 22 and 23, having a gate electrode 24 with a thin oxide 25 therebetween. The outer $N^+$ region 22 is coupled to an adjacent outer $P^+$ conductivity region 26 by a contact or bus 27, which is connected to a negative voltage source Vss or ground. The Vss source is also coupled to the gate electrode 24 to keep the LVTSCR OFF during normal operation. To complete the LVTSCR, an N-well 28 is provided in substrate 21 that substantially overlaps N+ region 23 and extends laterally beyond a second N+ region 29 which is coupled to an adjacent inner P+ conductivity region 30 by a contact or bus 31 connected to a Pad/Internal Circuit.

However, there exist a danger, since the N-well is lightly doped, that the SCR turn-on voltage may still be so high that the gate oxide of NMOS devices may become damaged. Thus, the LVTSCR device turn-on voltage is dependent on the NMOS breakdown voltage. It is therefore desirable to be able to reduce the trigger voltage required to turn ON a protective SCR as much as possible.

Figure 2:
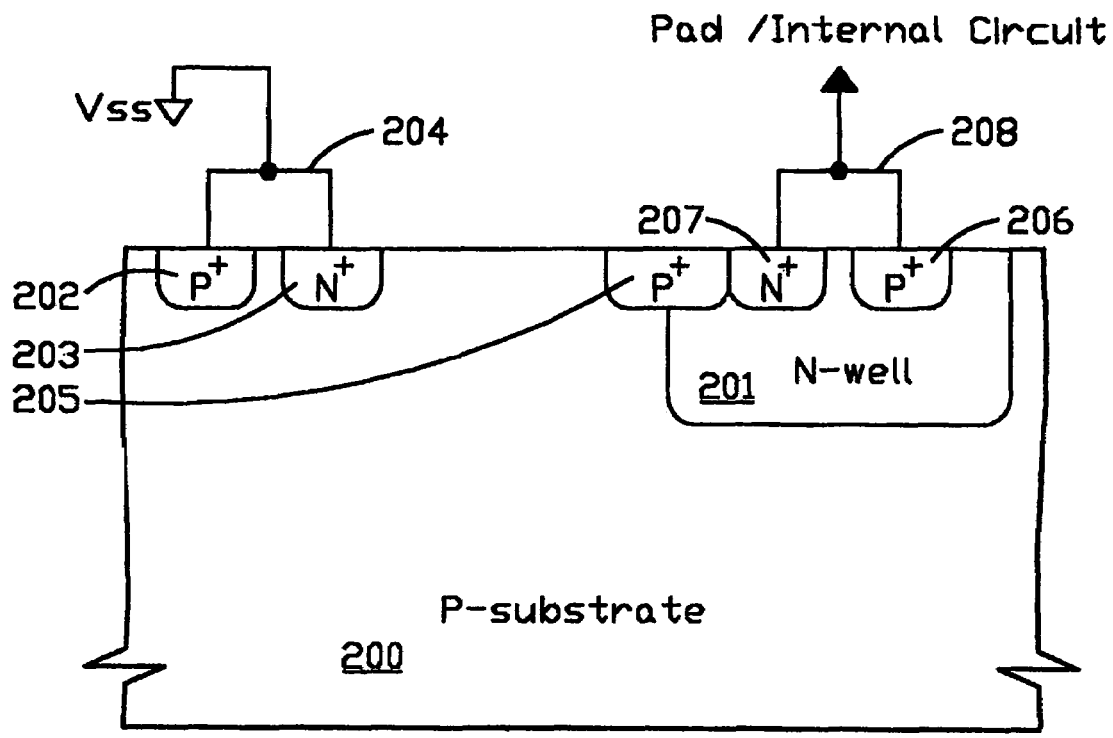
FIG. 2 is a cross-sectional view of one embodiment of the present invention.

Therefore, as referring to FIG. 2, an arrangement for providing a low voltage trigger source for a protective SCR in accordance with an embodiment of the present invention is shown, wherein an improved low voltage trigger source is produced for the SCR by using a zener diode N+-P+ junction under a reverse bias. A semiconductor substrate 200 having a first conductivity type, preferably P-type conductivity, is provided. A well region 201 formed in the semiconductor substrate 200, where the well region 201 being of a second conductivity type which is different from the first conductivity type, preferably N-type conductivity. A first P+ conductivity region 202 formed within the semiconductor substrate 200 and outside the well region 201. A first N+ conductivity region 203 formed within the semiconductor substrate 200 and in between the first P+ conductivity region 202 and the well region 201. The first P+ conductivity region 202 is coupled to its adjacent N+ conductivity region 203 by a contact or bus 204, that is the cathode of the silicon-control-rectifier device, which is connected to a negative voltage source Vss or ground.

Moreover, a second P+ conductivity region 205 formed having a portion in the well region 201 and another portion outside the well region, but still within the semiconductor substrate 200. A third P+ conductivity region 206 formed in the well region 201. A second N+ conductivity region 207 also formed within the well region 201 and in between the second P+ conductivity region 205 and the third P+ conductivity region 206. The third P+ conductivity region 206 is coupled to its adjacent N+ conductivity region 207 by another contact or bus 208, that is the anode of the silicon-control-rectifier device, which is connected to a pad/internal circuit. Furthermore, the second P+ conductivity region 205 and the second N+ conductivity region 207 form the P+-N+ junction of the zener diode. The breakdown voltage of the zener diode is controlled by adjusting the P+ doping in the conductivity region 205, where the higher doping the lower the breakdown voltage. Nevertheless, the leaking current is in direct proportion with the doping density, hence, a doping concentration in a range of about $1 \times 10^{18}$ to about $1 \times 10^{19}$ cm$^{-3}$ is preferred for achieving a triggering voltage ranging in between about 5 and 10 volts.

Figure 3:
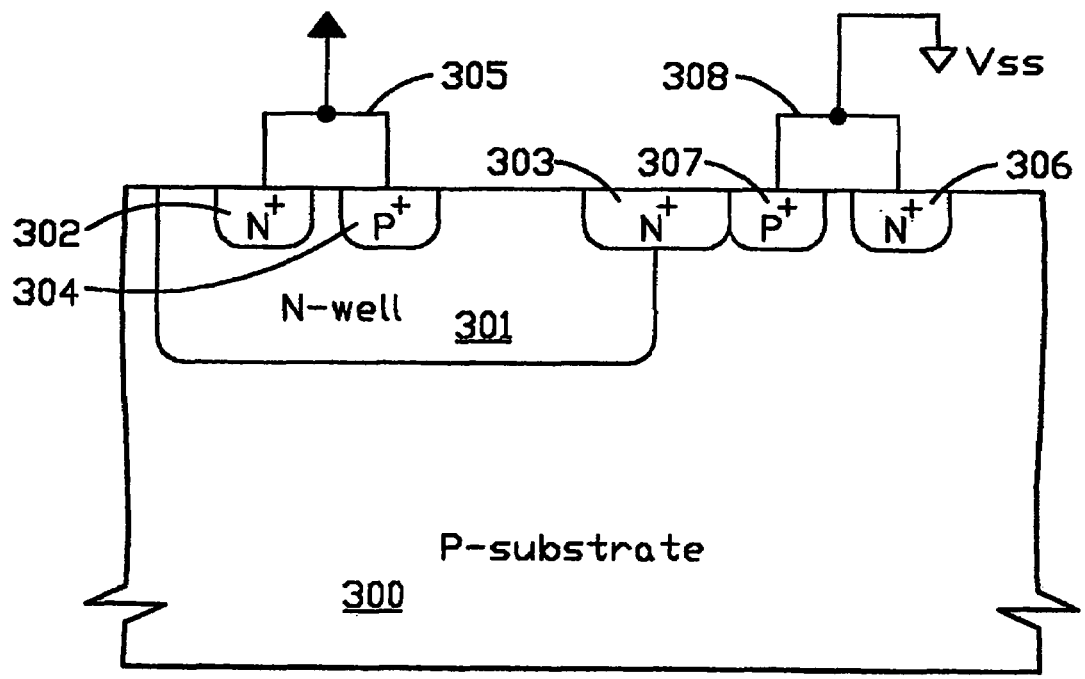
FIG. 3 is a cross-sectional view of another embodiment of the present invention.

Now, according to FIG. 3, an arrangement for providing a low voltage trigger source for a protective SCR in accordance with an another embodiment of the present invention is shown, wherein an improved low voltage trigger source is produced for the SCR by also using a zener diode N+-P+ junction under a reverse bias but at different location. A semiconductor substrate 300 having a first conductivity type, preferably P-type conductivity, is provided. A well region 301 formed in the semiconductor substrate 300, where the well region 301 being of a second conductivity type which is different from the first conductivity type, preferably N-type conductivity. A first N+ conductivity region 302 formed in the well region 301. A second N+ conductivity region 303 formed having a portion in the well region 301 and another portion outside the well region, but still within the semiconductor substrate 300. A first P+ conductivity region 304 formed within the well region 301 and in between the first N+ conductivity region 302 is coupled to its adjacent P+ conductivity region 304 by a contact or bus 305, that is the anode of the silicon-control-rectifier device, which is connected to a pad/internal circuit.

Moreover, a third N+ conductivity region 306 formed within the semiconductor substrate 300 and outside the well region 301. A second P+ conductivity region 307 also formed within the semiconductor substrate 300 and in between the second N+ conductivity region 303 and the third N+ conductivity region 306. The third N+ conductivity region 306 is coupled to its adjacent P+ conductivity region 307 by another contact or bus 308, that is the cathode of the silicon-control-rectifier device, which is connected to a negative voltage source Vss or ground. Furthermore, the second N+ conductivity region 303 and the second P+ conductivity region 307 form the N+-P+ junction of the zener diode. The breakdown voltage of the zener diode is controlled by adjusting the N+ doping in the conductivity region 303, where the higher the doping the lower the breakdown voltage. Nevertheless, the leaking current is in direct proportion with the doping density, hence, a doping concentration in a range of about $1 \times 10^{18}$ to about $1 \times 10^{19}$ cm$^{-3}$ is preferred for achieving a triggering voltage ranging in between about 5 and 10 volts.

Figure 4:
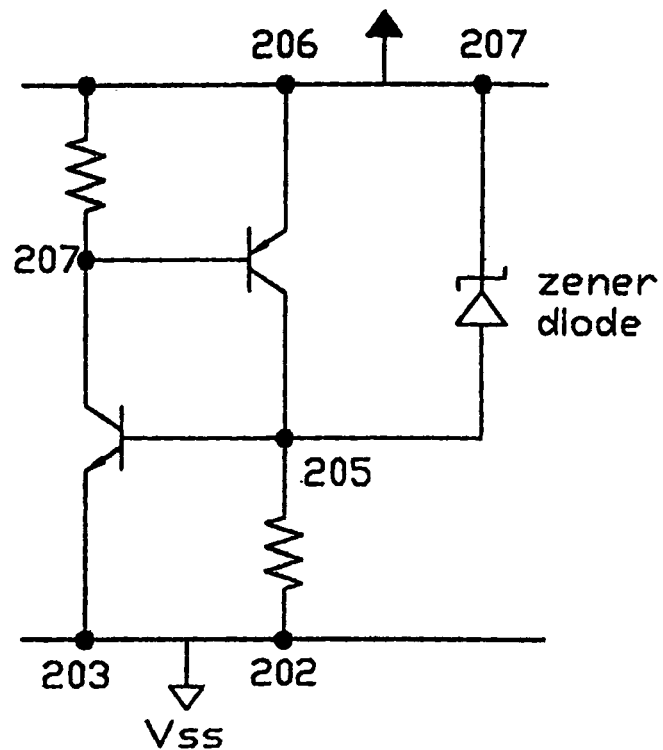
FIG. 4 is the circuit diagram of the complementary metal-oxide semiconductor silicon-control-rectifier structure illustrated in FIG. 2.

Referring to FIG. 4, this shows a circuit diagram, which is returned from the FIG. 2. This circuit comprises a PNP bipolar junction transistor, a NPN bipolar junction transistor, and a zener diode. The PNP bipolar junction transistor comprises the third P+ conductivity region 206, the second N+ conductivity region 207, and the second P+ conductivity region 205. The NPN bipolar junction transistor comprises the second N+ conductivity region 207, the second P+ conductivity region 205, and the first N+ conductivity region 203. The zener diode comprises the second N+ conductive region 207 and the second P+ conductivity region 205. The second N+ conductivity 207 and the second P+ conductivity region 205. The second N+ conductivity region 207 and the second P+ conductivity region 205 of the zener diode are connected with the third P+ conductivity region 206 and the second P+ conductivity region 205 of the PNP bipolar junction transistor. The first P+ conductivity region 202 is connected with the second P+ conductivity region 205 and the first N+ conductivity region 203. The second N+ conductivity region 207 is common used in the PNP bipolar junction transistor, the NPN bipolar junction transistor, and the zener diode. The second P+ conductivity region 205 are common used in the PNP bipolar junction transistor and the NPN bipolar junction transistor. The negative voltage source Vss or ground is connected with the place between the first N+ conductivity region 203 and the first P+ conductivity region 202 by using a line. The pad/internal circuit is connected with the place between the third P+ conductivity region 206 and the second N+ conductivity region 207 by using a line. The zener diode just can drive one of the PNP bipolar junction transistor and the NPN bipolar junction transistor.

Figure 5:
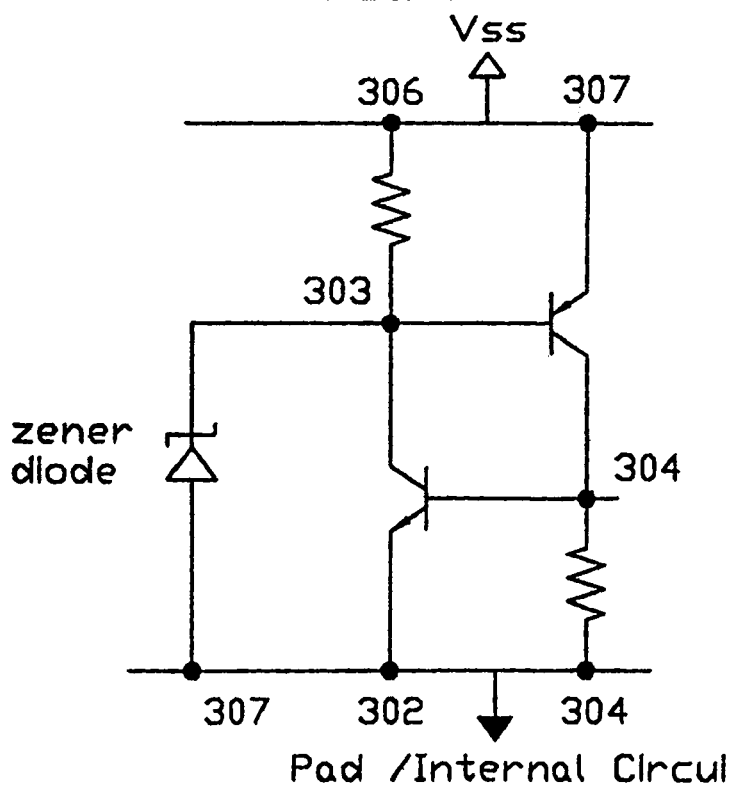
FIG. 5 is the circuit diagram of the complementary metal-oxide semiconductor silicon-control-rectifier structure illustrated in FIG. 3.

Referring to FIG. 5, this shows a circuit diagram, which is returned from the FIG. 3. This circuit comprises a PNP bipolar junction transistor, a NPN bipolar junction transistor, and a zener diode. The PNP bipolar junction transistor comprises the second P+ conductivity region 307, the second N+ conductivity region 303, and the first P+ conductivity region 304. The NPN bipolar junction transistor comprises the second N+ conductivity region 303, the first P+ conductivity region 304, and the first N+ conductivity region 302. The zener diode comprises the second P+ conductivity region 307 and the second N+ conductivity region 303. The second P+ conductivity region 307 and the second N+ conductivity region 303. The second P+ conductivity region 307 and the second N+ conductivity region 303 of the zener diode are connected with the first N+ conductivity region 302 and of the second N+ conductivity region 303 of the NPN bipolar junction transistor. The third N+ conductivity region 306 is connected with the second P+ conductivity region 307 of the zener diode and the second N+ conductivity region 303 of the NPN bipolar junction transistor. The second N+ conductivity region 303 is common used in the PNP bipolar junction transistor, the NPN bipolar junction transistor, and the zener diode. The first P+ conductivity region 304 are common used in the PNP bipolar junction transistor and the NPN bipolar junction transistor. The negative voltage source Vss or ground is connected with the place between the second P+ conductivity region 307 and the third N+ conductivity region 306 by using a line. The pad/internal circuit is connected with the place between the first P+ conductivity region 304 and the first N+ conductivity region 302 by using a line. The zener diode just can drive one of the PNP bipolar junction transistor and the NPN bipolar junction transistor.

In conclusion, an enhanced ESD protection performance apparatus for protecting VLSI circuits and particularly CMOS devices by reducing the trigger voltage required in turning ON a protective SCR is disclosed in the present invention. The apparatus includes a zener diode that acts as a trigger for the SCR protection device. There are two embodiments been proposed by the present invention, where they both utilize zener diode n+-p+ junction under a reverse bias, the larger the bias the stronger the electric field in the depletion region. Hence, a junction breakdown is likely to occur and making an early trigger for SCR turn-on.

Although specific embodiments have been illustrated and described, it will be obvious to those skilled in the art that various modifications may be made without departing from what is intended to be limited solely by the appended claims.

What is claimed is:

1. An electrostatic discharge protection device, including a silicon-control-rectifier, in complementary metal-oxide semiconductor process, said device comprising:
   a semiconductor substrate having a first conductivity type;
   a well region formed in said semiconductor substrate, said well region being of a second conductivity type which is different from said first conductivity type;
   a first region formed in said well region, said first region being of said second conductivity type;
   a second region formed having a portion in said well region and another portion outside said well region, but still within said semiconductor substrate, said second region being of said second conductivity type;
   a third region formed within said well region and in between said first region and said second region, said third region being of said first conductivity type;
   a first contact on said device coupled to said first region and said third region, and connected to an input/output pad;
   a fourth region formed within said semiconductor substrate and outside said well region, said fourth region being of said second conductivity type;
   a fifth region formed within said semiconductor substrate and in between said second region and said fourth region, said fifth region being of said first conductivity type wherein said second and fifth regions form the n+-p+ junction of a zener diode; and
   a second contact on said device coupled to said fourth region and in electrical contact with said fifth region, and connected to a Vss source, wherein said fifth regions is part of said zener diode and part of said second contact simultaneously.

2. The protection device in accordance with claim 1, wherein said first conductivity type is p-type.

3. The protection device in accordance with claim 2, wherein said third region is p-type of a higher doping level than said semiconductor substrate.

4. The protection device in accordance with claim 2, wherein said fifth region is p-type of a higher doping level than said semiconductor substrate.

5. The protection device in accordance with claim 1, wherein said second conductivity type is n-type.

6. The protection device in accordance with claim 5, wherein said first region is n-type of a higher doping level than said well region.

7. The protection device in accordance with claim 5, wherein said second region is n-type of a higher doping level than said well region, having a doping concentration in a range of about $1\times10^{18}$ to about $1\times10^{19}$ cm$^{-3}$.

8. The protection device in accordance with claim 5, wherein said fourth region is n-type of a higher doping level than said well region.

9. The protection device in accordance with claim 1, wherein said first and second contacts form an anode and a cathode of a silicon-control-rectifier device respectively.

10. An electrostatic discharge protection device, including a silicon-control-rectifier, in complementary metal-oxide semiconductor process, said device comprising:
   a semiconductor substrate having a first conductivity type;
   a well region formed in said semiconductor substrate, said well region being of a second conductivity type which is different from said first conductivity type;
   a first region formed in said well region, said first region being of said second conductivity type;
   a second region formed having a portion in said well region and another portion outside said well region, but still within said semiconductor substrate, said second region being of said second conductivity type;
   a third region formed within said well region and in between said first region and said second region, said third region being of said first conductivity type, wherein said first region, said third region, and said second region can be combined to become a first bipolar junction transistor;
   a first contact on said device coupled to said first region and said third region, and connected to an input/output pad;
   a fourth region formed within said semiconductor substrate and outside said well region, said fourth region being of said second conductivity type;
   a fifth region formed within said semiconductor substrate and in between said second region and said fourth region, said fifth region being of said first conductivity type, wherein said third region, said second region, and said fifth region can be combined to become a second bipolar junction transistor and said second region and said fifth region can be combined to become a zener diode, said zener diode driving one of said first bipolar junction transistor and said second bipolar junction transistor; and a second contact on said device coupled to said fourth region and in electrical contact with said fifth region, and connected to a Vss source, wherein said fifth regions is part of said zener diode and part of said second contact simultaneously.

11. The protection device in accordance with claim 10, wherein said first conductivity type is p-type.

12. The protection device in accordance with claim 11, wherein said third region is p-type of a higher doping level than said semiconductor substrate.

13. The protection device in accordance with claim 11, wherein said fifth region is p-type of a higher doping level than said semiconductor substrate.

14. The protection device in accordance with claim 10, wherein said second conductivity type is n-type.

15. The protection device in accordance with claim 14, wherein said first region is n-type of a higher doping level than said well region.

16. The protection device in accordance with claim 14, wherein said second region is n-type of a higher doping level than said well region, having a doping concentration in a range of about $1\times10^{18}$ to about $1\times10^{19}$ cm$^{-3}$.

17. The protection device in accordance with claim 14, wherein said fourth region is n-type of a higher doping level than said well region.

18. The protection device in accordance with claim 10, wherein said first and second contacts form an anode and a cathode of a silicon-control-rectifier device respectively.

* * * * *